United States Patent [19]

Fan

[11] 4,311,784

[45] Jan. 19, 1982

[54] MULTILAYER PHOTOSENSITIVE SOLVENT-PROCESSABLE LITHO ELEMENT

[75] Inventor: Roxy N. Fan, East Brunswick, N.J.

[73] Assignee: E. I. Du Pont de Nemours and Company, Wilmington, Del.

[21] Appl. No.: 142,023

[22] Filed: Apr. 21, 1980

Related U.S. Application Data

[63] Continuation of Ser. No. 904,257, May 9, 1978, abandoned.

[51] Int. Cl.$^3$ .............................................. G03C 1/78
[52] U.S. Cl. .................................. 430/271; 430/302; 430/309; 430/322
[58] Field of Search ............... 430/513, 514, 515, 271, 430/302, 309, 322

[56] References Cited

U.S. PATENT DOCUMENTS

| | | | |
|---|---|---|---|
| 2,791,504 | 5/1957 | Plambeck | 96/84 R |
| 3,879,920 | 4/1975 | Gervay | 96/84 R |
| 4,123,272 | 10/1978 | Quinn | 430/329 |
| 4,126,466 | 11/1978 | Roos | 96/84 UV |

FOREIGN PATENT DOCUMENTS

| | | |
|---|---|---|
| 778333 | 11/1971 | Belgium . |
| 842533 | 12/1976 | Belgium . |
| 842534 | 12/1976 | Belgium . |
| 848409 | 5/1977 | Belgium . |
| 52-89916 | 7/1977 | Japan . |
| 7413916 | 10/1974 | Netherlands . |

*Primary Examiner*—Jack P. Brammer

[57] ABSTRACT

An improved photosensitive litho element comprises, in order, a support, a non-photosensitive solvent-soluble contiguous layer having an optical density of at least 3.0 in the visible region of the spectrum and a maximum thickness of 0.015 mm, and a solvent-processable photosensitive layer. Dot-etchable contact litho negatives and positives are provided.

11 Claims, No Drawings

MULTILAYER PHOTOSENSITIVE SOLVENT-PROCESSABLE LITHO ELEMENT

This is a continuation, of application Ser. No. 904,257 filed May 9, 1978 now abandoned.

BACKGROUND OF THE INVENTION

1. Field of the Invention

The invention relates to photosensitive litho elements. More particularly this invention relates to photosensitive elements having a solvent-processable photosensitive layer and a non-photosensitive solvent-soluble dye or pigment containing contiguous layer.

2. Description of the Prior Art

Photosensitive elements are known which are useful as contact speed lithographic films. In assignee's Bratt and Cohen U.S. application Ser. No. 741,039, filed Nov. 11, 1976 now abandoned there is disclosed a photopolymerizable litho element wherein the photopolymerizable layer has an optical density of at least 3.0 in the visible region of the spectrum and a maximum thickness of 0.015 mm. Such an element can undergo a treatment known as "dot-etching" which is a reduction in the size of or "etching" the halftone dots formed when the element is exposed to actinic radiation through a halftone screen and developed. Such a lithographic element has advantages over silver halide containing materials. The element has some disadvantage, however, in that the presence of pigment or dye in the photopolymerizable layer in the amount required to give an optical density of at least 3.0 can cause an increase in exposure time as well as have an effect on the photopolymerizable layer.

Two layer photopolymerizable photoresist-forming elements are known wherein one of the layers is non-photosensitive. One such element is described in published Dutch application No. 74,13916. The Dutch application is silent with respect to photosensitive litho elements which are dot-etchable since there is no disclosure of a thin lower nonphotosensitive layer having a maximum thickness of 0.015 mm containing a quantity of pigment or dye in an amount to provide an optical density in the visible region of the spectrum of at least 3.0.

SUMMARY OF THE INVENTION

In accordance with this invention, in a photosensitive dot-etchable litho element having a sheet support and a solvent-processable non-silver halide photosensitive layer, either the exposed or unexposed areas of the solvent-processable photosensitive layer, after imagewise exposure of the element to actinic radiation, being solvent-soluble, there is provided an improvement wherein between the support and the photosensitive layer and contiguous thereto is present a nonphotosensitive, solvent-soluble dye or pigment-containing layer having an optical density of at least 3.0 in the visible region of the spectrum and a maximum thickness of 0.015 mm.

DETAILED DESCRIPTION OF THE INVENTION

The element of the invention is capable of producing duplicate or reverse litho images as desired. Accordingly, with an element of the invention as described above, a desired image may be produced by exposing, e.g., through a halftone dot image, removing the cover sheet or layer if one is present, washing out areas of the photosensitive layer and at the same time or subsequently washing out the nonphotosensitive, contiguous layer. The contiguous layer provides an opaque layer, i.e., having an optical density greater than 3.0 in the visible region of the spectrum. The washed out images can be dot-etched by a process of undercutting the image areas by means of mechanical action such as spraying, brushing or rubbing. Dot-etching is reducing the size of, or etching the halftone dots, thereby changing the tone values of the image. The procedure of dot-etching is described in Bratt and Cohen U.S. application Ser. No. 741,039, filed Nov. 11, 1976, now abandoned.

The solvent-processable photosensitive layer is one which may be processed by wash out with a solvent after imagewise exposure to actinic radiation. Depending on the nature of the photosensitive layer, either the exposed or unexposed areas may be washed out, leaving the other areas remaining on the contiguous layer. The solvent-processable photosensitive layer may be a photohardenable material, e.g., comprised of photopolymerizable, photocrosslinkable, or photodimerizable material which hardens and becomes insoluble in the exposed areas or it may be a photosolubilizable, photodesensitizable or photodepolymerizable material which either is or becomes soluble in the exposed areas and is insoluble in the imagewise unexposed areas. In a particularly preferred embodiment, the photosensitive layer is photopolymerizable and upon exposure the exposed areas thereof become relatively insoluble in a solvent for the unexposed areas.

The contiguous layer is developed by washing out the bared areas from which the solvent-processable layer is washed out. Wash out may occur at the same time or subsequent to the wash out of the photosensitive layer, depending, of course, on the materials used for the photosensitive and nonphotosensitive layers and the solvent(s) chosen. By "washing out" is meant the removal of material by using a solvent, which may include agitation in a bath of solvent, with the aid of mechanical action such as brushing or spraying. The insoluble property of the remaining areas of the solvent-processable layer and the soluble property of the contiguous layer may be due to their respective degrees of photohardening or degree of polymerization or to their respective degrees of absorptivity, hydrophilicity or reactivity with respect to the solvent.

Various solvents suitable for use are disclosed in the prior art. The particular solvent to be used will depend on the materials of which the photosensitive layer and the contiguous layer are composed. Hydrocarbon solvents such as 1,1,1-trichloroethane, benzene, trichloroethylene, and hexane, for example, are known in the art for washing out areas of polymeric layers for image development. In the case of certain polymers, aqueous solutions, such as are disclosed in U.S. Pat No. 3,475,171, may be used.

Preferred materials for the solvent-processable photosensitive layer include the photohardenable materials with ethylenically unsaturated or benzophenone-type groups in which an increase in molecular weight is caused by exposure to actinic radiation. The well-known photohardenable materials which are comprised of an ethylenically unsaturated material which is photopolymerizable, photocrosslinkable or photodimerizable are preferred. Such materials are described, for example, in U.S. Pat. No. 3,649,268. Also, useful are the diazotized condensates, for example, diazotized phenolformaldehyde resins as described in Kosar, Light Sensitive Systems, Wiley, Chapter 7, 1965. Additional useful compositions are those described in U.S. Pat. Nos. 3,782,951; 3,849,392; and 3,888,672; and Belgian Pat. No. 542,566.

Particularly preferred are photopolymerizable compositions comprised of a macromolecular organic polymer binder and an addition polymerizable ethylenically unsaturated monomer. Such monomers have one or more terminal ethylenic groups capable of free radical initiated, chain propagated, addition polymerization. The photopolymerizable composition also contains a free radical generating addition polymerization photoinitiating system (i.e., at least one organic photoinitiator compound) activatable by actinic radiation, e.g. ultraviolet and visible radiation. Numerous monomers and polymeric binders for such compositions are described in the prior art such as U.S. Pat. Nos. 2,760,863; 3,380,831; and 3,573,918.

The solvent-processable layer may be comprised of materials which become soluble on exposure to actinic radiation but which are insoluble before exposure. Such materials include photosoluble compositions, e.g., polymers containing pendent o-quinone diazide groups as described in U.S. Pat. No. 3,837,860, and polymers mixed with bisdiazonium salt compositions, e.g., such as those described in U.S. Pat. No. 3,778,270 and the diazonium binder systems described in Kosar, Light Sensitive Systems, Wiley, Chapter 7, 1965 and photodesensitizable compositions described in U.S. Ser. No. 758,699, filed Jan. 17, 1977 now abandoned and U.S. Pat. No. 4,029,505. Example 9 below illustrates the latter type composition.

The solvent-processable photosensitive layer may also contain other ingredients including plasticizers, antihalation agents and optical brightening agents. The solvent-processable photosensitive layer can have incorporated therein transparent dye colorants or pigment type colorants. By incorporating a colorant in the photosensitive layer, there is provided a visual aid for inspecting the image areas after solvent processing.

While the coating weight of the solvent-processable photosensitive composition may be varied, it has been found that a preferred range from 5-1500 mg/dm$^2$ (providing a dry layer thickness of about 0.000015-0.005 inch, ~0.0004-0.127 mm) will give good image quality and tonal range.

A strippable cover sheet may be employed on the element of the invention. It must be strippable from the rest of the element without damage to the element. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. While the thickness of the cover sheet may be varied over a wide range, films having a thickness of 0.001 inch (0.025 mm) or less are particularly preferred. These cover sheets enable halftone dots with sharp edges to be produced upon exposure with a halftone screen. In addition a tonal range of 2%-98% dot resolution (using a halftone screen with 150 lines/inch, 59.06 lines/cm.) is obtainable with thin cover films. By "tonal range" is meant the range of sizes of areas covered by resolvable halftone dots as a percentage of the total area of the field. Instead of a strippable cover sheet a removable (e.g., solvent-soluble) layer such as described in U.S. Pat. No. 3,458,311 may be employed. The cover sheet should be thick enough so that it may be stripped without tearing. The cover sheet may additionally comprise auxiliary treatments or layers to improve adhesion, strength, and other properties.

The contiguous layer is a thin, solvent-soluble, opaque, polymeric or colloid layer which is insensitive to actinic radiation (nonphotosensitive) and which remains adhered to the insoluble image areas of the photoexposed photosensitive layer. The contiguous layer must have an optical density high enough to produce with a very thin layer an opaque image useful as a mask. If coating thickness is too great, undercutting may cause uncontrolled or excessive loss of portions of the image. Also, if the layer is too thick, small image dots which comprise an insoluble cap of photosensitive material resting on a tall column of soluble opaque material are exceedingly fragile and subject to breaking off. The coating weight of the layer can be varied over a wide range, but generally a coating weight of about 40 mg/dm$^2$ (generally providing a dry thickness of about 0.00015 inch, 0.0038 mm) will be satisfactory. Preferred dry coating thickness is from 0.000045 to 0.0006 inch (0.0011 to 0.015 mm). Thicknesses of 0.0001 inch (0.0025 mm) to 0.0004 inch (0.010 mm) are particularly preferred. The optical density of the layer, which is the result of the light absorbance of the colorant and all other materials in the layer, is at least 3.0 and preferably at least 4.0. A layer having an optical density of 3.0 in the visible region of the spectrum absorbs 99.9% of the incident visible radiation, while a layer with an optical density of 4.0 absorbs 99.99%.

Any suitable solvent may be used to coat the contiguous layer as long as it does not cause migration of components of the layer into the photosensitive layer when the two layers are coated simultaneously. The contiguous layer may also be coated as a dispersion, e.g., an aqueous dispersion, with satisfactory results.

Colorants, i.e., dyes or pigments, are incorporated in the coating composition for the contiguous layer in an amount to obtain an optical density in a thin layer of at least 3.0 throughout the visible region of the spectrum and preferably in the ultraviolet region of the spectrum as well. This frequently requires a high percentage of dyes and/or pigments, usually between 15-40%, by weight, of the contiguous layer. Colloidal carbon is a particularly preferred pigment, however, a number of dyes, U.V. absorbers, and pigments may be used either individually or in combination to produce visibly opaque layers. Examples of dyes and U.V. absorbers which are useful are as follows:

2,2'-dihydroxy-4-methoxy-benzophenone
4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
2-hydroxy-4-methoxybenzophenone
2,2'-dihydroxy-4,4'-dimethoxy-benzophenone
2,2',4,4'-tetrahydroxybenzophenone
2-hydroxy-4-methoxy-benzophenone-5-sulfonic acid
(also sodium salt of above)
ethyl-2-cyano-3,3-diphenylacrylate
2-ethylhexyl-2-cyano-3,3-diphenylacrylate
Luxol ® Orange GRL Color Index #25 (Solvent Orange)

Luxol® Orange GS Color Index #24 (Solvent Orange)
Luxol® Orange R Color Index #20 (Solvent Orange)
Plasto® Orange M Color Index #21 (Solvent Orange)
Plasto® Orange RS Color Index #22 (Solvent Orange)
Grasol® Fast Orange 2RN Color Index #33 (Solvent Orange)
Oil Orange Color Index #12055 (Solvent Yellow #14)
Sudan Orange RA Color Index #12055 (Solvent Yellow #14)
Luxol® Yellow G Color Index #45 (Solvent Yellow)
Luxol® Yellow T Color Index #47 (Solvent Yellow)
Plasto® Yellow GR Color Index #39 (Solvent Yellow)
Plasto® Yellow MGS Color Index #40 (Solvent Yellow)
Oil Yellow 3G Color Index #29 (Solvent Yellow)
Oil Yellow N Color Index #2 (Solvent Yellow)
Sudan Yellow Color Index #30 (Solvent Yellow)
Luxol® Fast Blue AR Color Index #37 (Solvent Blue)
Luxol® Fast Black L Color Index #17 (Solvent Black)
Primrose Yellow Color Index #77603 (Pigment)
Chrome Yellow Light Color Index #77603 (Pigment)
Chrome Yellow Medium Color Index #77600 (Pigment)
Dispersed Manganese dioxide
Toluidine Yellow GW Color Index #71680 (Pigment)
Molybdate Orange Color Index #77605 (Pigment)
Dalamar Yellow Color Index #11741 (Pigment)
Green Gold Color Index #12775 (Pigment)
Graphtol Yellow Color Index Pigment Yellow #61
Graphtol Orange Color Index Pigment Orange #13

In addition to colorants, the contiguous layer also comprises a film forming material which is solvent-soluble and is substantially insensitive to the actinic radiation used for exposure of the photosensitive layer. The film forming material typically contains a binder along with other minor constituents such as plasticizers, coating aids, and in some instances tackifiers. The binder used is an organic polymeric material, or colloid, that is preferably solid at 50° C., and which is compatible with the incorporated colorant. With these materials, a stable adhesion balance between the solvent-processable photosensitive layer and a support for the contiguous layer can be achieved so that insoluble image areas remain firmly adhered during and after processing of the elements.

A wide variety of suitable non-elastomeric binders, both thermoplastic and nonthermoplastic, is disclosed in U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in U.S. Pat. Nos. 2,760,863 and 2,791,504. Still other useful binders are the N-methoxymethyl polyhexamethylene adipamide mixtures of British Pat. No. 826,272, the polyester, polyacetal or mixed polyesteracetal mixtures of U.S. Pat. No. 2,892,716; the fusible polyvinyl alcohol derivatives of U.S. Pat. No. 2,902,365; the fusible blends of selected organic-soluble, base-soluble cellulose derivatives of U.S. Pat. No. 2,902,365; the fusible blends of selected organic-soluble, base-soluble cellulose derivatives of U.S. Pat. No. 2,927,022; the polyvinyl acetals having extralinear vinyldiene groups of U.S. Pat. No. 2,902,710; the linear polyamides containing extralinear N-acrylyloxymethyl groups of U.S. Pat. No. 2,972,540.

Elastomer rubber type polymers, both natural and synthetic, may be used, e.g., isobutylene, Thiokol A, nitrile rubbers, butyl rubber, chlorinated rubbers, polymers of butadiene, poly(vinylisobutylether), isoprene and random, teleblock and block copolymers, terpolymers or higher polymers, e.g., butadiene copolymerized with styrene, isoprene and neoprene, silicone elastomers, acrylic containing elastomers, etc. in various proportions.

Particularly preferred as binders are nonelastomeric, acidic, polymeric, organic compounds since the composition resulting is developable in solely aqueous alkaline solvent devoid of organic solvents. This is advantageous since organic solvents are costly, may be hazardous with respect to toxicity and/or flammability, may become scarce due to petrochemical shortages, and may pollute the air and water.

One class of film-forming binders which is soluble in aqueous alkaline media and is useful in the compositions of the present invention is vinyl addition polymers containing free carboxylic acid groups, which are prepared from 30 to 94 mole percent of one or more alkyl acrylates and 70 to 6 mole percent of one or more alpha-beta-ethylenically unsaturated carboxylic acids, and more preferably prepared from 61 to 94 mole percent of two alkyl acrylates and 39 to 6 mole percent of an alpha-beta-ethylenically unsaturated carboxylic acid. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application, OS No. 2,320,849, published Nov. 8, 1973.

The advantages of using acidic binders can also be obtained by selecting a preformed, compatible macromolecular polymeric binding agent which is a copolymer of (1) a styrene-type of a vinyl monomer and (2) an unsaturated carboxyl-containing monomer, as described in detail in British Pat. No. 1,361,298.

Suitable support materials to which the contiguous layer remains adhered include films composed of high polymers, which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the contiguous layer and any soluble sub or underlayer should not exceed 0.006 inch (0.015 mm). By "soluble" is meant solubility in a solvent in which the contiguous layer is developable. Preferred soluble sub layers have a thickness not exceeding about 0.0002 inch (0.005 mm).

Where the particular application does not require that the base support be transparent, the contiguous composition may usefully be coated on an opaque support, such as paper, especially water-proof photographic paper; thin metal sheets, especially aluminum and copper sheets, cardboard and the like.

EXAMPLES OF THE INVENTION

The following examples illustrate the invention when the parts are by weight, unless otherwise indicated.

EXAMPLE 1

An aqueous developable element is made as follows:

I. Photohardenable Layer: Photopolymerizable Coating Composition

An untreated, unsubbed polyethylene terephthalate film having a thickness of 0.001 inch is coated with the following photopolymerizable composition:

| Component | Amount (g.) |
| --- | --- |
| Methylene chloride solvent | 1375.0 |
| Methanol solvent | 130.0 |
| Trichloroethylene solvent | 2795.0 |
| Poly(methyl methacrylate/methacrylic acid) (90/10) (MW 30,000–50,000) | 369.0 |
| Poly(ethylene oxide) (MW ca. 1,000,000) | 2.5 |
| Tetraethylene glycol dimethacrylate | 141.5 |
| 2,2'-bis(2-chlorophenyl)-4,4',5,5'-tetraphenyl biimidazole | 14.75 |
| 2-(stilbyl-4'')-(naptho-1',2':4,5)-1,2,3-triazol-2''-sulfonic acid phenyl ester | 3.85 |
| 7-(4'-chloro-6'-diethylamino-1',3',5'-triazine-4'-yl)amino-3-phenyl-coumarin | 17.15 |
| 2,2'-dihydroxy-4-methoxybenzophenone | 1.35 |
| 2-mercaptobenzothiazole | 9.85 |

The thickness of the dried photopolymerizable layer is about 0.0025 mm.

II. Opaque Contiguous Layer

| Component | Amount (g.) |
| --- | --- |
| Methylene chloride solvent | 2733 |
| 2-ethoxy ethanol solvent | 229.0 |
| 1:1 copolymer of styrene and maleic anhydride, partially esterified with isopropyl alcohol, MW ca. 1700, acid number ca. 270 | 123.0 |
| Polyethylene oxide | 1.2 |
| Triethylene glycol dimethacrylate | 82.0 |
| Lacer Wax (pentaerythritol of fatty acids derived from grape seed oil) | 144.0 |
| Fluocarbon surfactant FC-430 (a product of 3M Co.) | 0.25 |
| 2,2'-methylene bis(4-ethyl-6-tert-butyl phenol) | 0.06 |
| Carbon black | 180.0 |

This composition is coated on resin subbed 0.005 inch polyethylene terephthalate film wherein the resin sub is alkali soluble to give a dry coating thickness of about 0.008 mm and an optical density of about 3.15.

III. Laminate Procedure

Elements from I and II are laminated in surface to surface contact of the coated layers at 50° C.

IV. Exposure and Development

The element is exposed to a halftone image transparency for 30 seconds with a 4 KW pulsed xenon arc. The 0.001 inch thick polyethylene terephthalate cover sheet is stripped off and the imaged photopolymerizable layer and opaque contiguous layer is developed by immersion for 120 seconds at 20° C. in a developer of the following composition:

| Deionized water | 750 ml. |
| --- | --- |
| Butyl Cellosolve | 60 ml. |
| Octyl phenoxy polyethoxy (9 or 10) ethanol (10% H₂O solution) | 2 ml. |
| Sodium silicate (37.60% solid) | 66.5 g. |
| Deionized water to make | 1.0 liter |

After 60 seconds immersion the element is brushed to complete the development and to dot-etch the resulting halftone image.

The element is rinsed with tap water for 1 minute, blotted dry, and blown with hot air. During the development step unexposed areas of the photopolymerizable layer are removed along with the underlying areas of the opaque contiguous layer. As development continues with brushing, opaque material is removed from under the edges of exposed photohardened image areas, i.e., imaged halftone dots, and the undercut, unsupported photohardened edges are mechanically removed by the brushing thereby producing a dot-etched, contact litho negative of the original contact transparency.

EXAMPLE 2

A solvent developable element is made as follows:

I. Photohardenable Layer: Photopolymerizable Coating Composition

A polypropylene film having a thickness of 0.001 inch is coated with the following photopolymerizable composition:

| Component | Amount (g.) |
| --- | --- |
| Polymethyl methacrylate (M.W. ~40,000) | 20.0 |
| Trimethylolpropane trimethacrylate | 15.0 |
| (2-o-chlorophenyl-4,5-diphenyl imidazolyl) dimer | 1.0 |
| 2-(stilbyl-4'')-(naphtho-1',2':4,5)-1,2,3-triazol-2-sulphonic acid phenyl ester | 0.7 |
| 7-(4'-chloro-6'-diethylamino-1',3',5'-triazine-4'-yl)amino-3-phenyl-coumarin | 0.3 |
| 2,2'-Dihydroxy-4-methoxybenzophenone | 0.6 |
| 2-Mercaptobenzothiazole | 0.6 |
| Polyoxyethylene lauryl ether | 3.0 |
| Methylene chloride | 800.0 |

II. Opaque Contiguous Layer

A water-soluble contiguous layer coating composition is made from the following components:

| Component | Amount (g.) |
| --- | --- |
| Polyvinyl pyrrolidone (20% solution) | 13.0 |
| Polyvinyl alcohol (10% solution) | 17.5 |
| Carbon black | 3.8 |
| Isooctyl phenyl polyethoxy | 5.0 |

-continued

| Component | Amount (g.) |
|---|---|
| ethanol (10% H₂O solution) | |
| Water | 49.0 |

This composition is coated on a 0.005 inch (0.13 mm) polyethylene terephthalate film having a gelatin sublayer to give a dry coating thickness of about 0.005 mm and an optical density of about 3.5.

III. Lamination Procedure

Elements from I and II are laminated in surface to surface contact of the coated layers at 50° C.

IV. Exposure and Development

The element is exposed to a halftone image transparency for 30 seconds with a 4 KW xenon arc. The 0.001 inch thick polypropylene cover sheet is stripped and the exposed photopolymerizable element is developed by spraying 10 seconds with methyl chloroform, followed by a water spray leaving a dot-etched black image. In this instance the water spray removes the bared areas of the black contiguous layer and dot-etches the resulting halftone image by the mechanical force of the spray. The image bearing element produced is useful as a contact litho negative of the original contact transparency.

EXAMPLE 3

An aqueous developable, photopolymerizable element with an oxygen barrier overcoating is made as follows:

A laminated element is prepared as described in Example 1. The 0.001 inch (0.025 mm) polyethylene terephthalate film is stripped off the photopolymerizable layer of the laminated element. Over the photosensitive layer there is coated an aqueous dispersion having the following composition:

| | | |
|---|---|---|
| A. | 16% aqueous solution of low viscosity polyvinyl alcohol (99% hydrolyzed polyvinyl acetate) | 2.7 Kg. |
| B. | (1) Co(vinyl pyrrolidone/vinyl acetate) (60:40) (M.W. 40,000–120,000) | 48.4 g. |
| | (2) Distilled water | 194.0 g. |
| | (3) Iso-octyl phenoxypolyethoxy ethanol (9–10 ethoxy groups) (10% solution) | 45.0 g. |
| | (4) Ethanol | 86.4 g. |
| | (5) Ethyl cellosolve | 100.0 g. |

Solution 'B' is thoroughly agitated and then added to solution 'A' with mechanical stirring to form the aqueous overcoating composition. The aqueous dispersion is coated with a top roll coating apparatus which is well known in the coating art. The coating is dried using infrared radiation. The dry coating weight is 16.3 mg/dm².

The coated element is exposed to a halftone image transparency for 30 seconds with a xenon arc. The exposed element is then developed and dot-etched by spraying the exposed, coated imaged surface with the developer of Example 1 for 120 seconds at 25° C. A halftone negative of the original transparency is obtained.

EXAMPLE 4

An aqueous developable element is made as follows:

I. Opaque Contiguous Layer

A 0.004 inch (0.10 mm) thick polyethylene terephthalate clear film support, prepared as described in Example IV of Alles U.S. Pat. No. 2,779,684, containing an insoluble resin sub on one side only is coated on the resin sub surface with the following coating composition:

| | Amount (parts) |
|---|---|
| Terpolymer formed from 56% ethyl acrylate, 37% methyl methacrylate and 7% acrylic acid, M.W. ca. 260,000, acid number 76–85. | 55 |
| Colloidal carbon | 45 |
| Stearic acid | 1 |

The above components are milled dry in a high shear mixer. The coating composition is prepared from 10 parts by weight of the milled material, 9 parts by weight of 2-ethoxyethanol and 81 parts by weight of methylene chloride and coated to give a dry thickness of about 0.005 mm and an optical density of about 3.5.

II. Photohardenable Layer: Diazo Coating Composition

A coating composition is prepared by mixing together the following ingredients:

| | Amount (parts) |
|---|---|
| Gelatin | 75 |
| Diazo Resin No. 4, Type L (Fairmount Chemical Co., Newark, N.J. | 120 |
| Isooctyl phenyl polyethoxy ethanol | 3 |
| Ethanol | 120 |
| Water | 3705 |

The coating composition is coated over the surface of the opaque contiguous layer and air dried to give a coating weight of about 14 mg/dm².

IV. Exposure and Delamination

The air dried element is exposed through a halftone image transparency for 10 seconds to a 2 KW pulsed xenon arc. The exposed element is processed by immersing in a 3% aqueous wash out solution of 9 parts by weight sodium carbonate and 1 part sodium bicarbonate at 80° F. for 3 seconds and then in 100° F. water for 10 seconds. During immersion in water the imaged surface is rubbed with a cotton swab. By this treatment the unexposed image areas and the bared carbon containing areas are removed from the film, and the resulting dot-etchable image areas are dot-etched to give a high contrast litho-negative of the original transparency.

EXAMPLE 5

A multilayer wash out element is made as follows:

I. Photohardenable Layer: Photopolymerizable Coating Composition

A coating composition is prepared by mixing together the following ingredients:

| | Amount (g.) |
|---|---|
| Poly(methyl methacrylate/methacrylic acid) (90/10) | 75.0 |
| Polyethylene glycol dimethacrylate | 57.5 |
| (2-o-Chlorophenyl-4,5-diphenyl imidazolyl) dimer | 3.0 |
| 2-(stilbyl-4″)-(naphtho-1′,2′:4,5)-1,2,3-triazol-2-sulphonic acid phenyl ester | 0.39 |
| 7-(4′-chloro-6′-diethylamino-1′,3′,5′-triazine-4′-yl)amino-3-phenyl-coumarin | 3.55 |
| 2,2′-Dihydroxy-4-methoxybenzophenone | 0.32 |
| 2,-Mercaptobenzothiazole | 2.0 |
| Methyl alcohol | 77.5 |
| Methylene chloride | 870.0 |

The resulting composition is coated on 0.0005 inch (0.013 mm) thick polyethylene terephthalate film at a coating weight of about 43 mg/dm² and is allowed to dry.

II. Opaque Contiguous Layer

A coating composition is made in the following manner:

| | Amount (g.) |
|---|---|
| Cis-polybutadiene | 360.0 |
| Random copolymer of styrene/butadiene | 240.0 |
| Tetra bis[methylene-3-(3′,5′-di-t-butyl-4-hydroxyphenyl) propionate] methane | 3.0 |
| Carbon black | 400.0 |
| Methylene chloride | 5400.0 |

The resulting composition was coated on the sub layer of a 0.007 inch thick (0.178 mm) polyethylene terephthalate clear film support, prepared as described in Example IV of Alles U.S. Pat. No. 2,779,684, containing an insoluble resin sub layer on one side only. The dried coating has an optical density greater than 3.0 and a coating weight of about 120 mg/dm².

III. Laminating Procedure

The two elements I and II are laminated in surface to surface relationship at a temperature of 90° C. and a pressure of 40 pounds per square inch (2.81 kg/cm.²).

IV. Exposure and Development

The resulting film is exposed through a positive transparency, (halftone dot comparator target and a $\sqrt[3]{2}$ density step wedge) and through the 0.0005 inch (0.013 mm) thick polyethylene terephthalate film side of the element using an exposing device identified as a nuArc Plate Maker (Flip-Top Model FT 266) at 220 volts using a pulsed xenon lamp at 17 amperes for 16 seconds. The 0.0005 inch (0.013 mm) film is stripped off and the exposed photopolymerizable layer is developed by immersion for 30 seconds at 20° C. in a developer of Example 1. The element is rinsed with tap water for 1 minute, is blotted dry and blown with dry hot air. During the development step, the unexposed photopolymerizable layer dissolves away and the opaque layer is uncovered. The opaque layer covered by the exposed photopolymerizable layer, is immersed in a hexane solution which only dissolves the bared uncovered opaque layer leaving a dot-etchable halftone litho-negative of the original transparency. The halftone image is dot-etched by rubbing with a cotton pad soaked with hexane solution.

EXAMPLE 6

An opaque contiguous layer is prepared as described in Example 2. A diallyl isophthalate prepolymer is then made according to the method described in U.S. Pat. No. 3,376,139. This photosensitive prepolymer is then dissolved in methyl isobutyl ketone (about 5:1 solvent:-prepolymer) and sensitized by adding 4,4′-bis(dimethylamine)benzophenone (0.01 g. of the sensitizer per 6.5 g. solution). The resulting solution is spray coated on top of the above opaque contiguous layer and dried. The dried layer is about 0.0025 mm thick. The element is exposed through a halftone image transparency for 2 minutes to a carbon arc (nuArc Plate Maker Model FT26M-2) at a distance of 18 inches (45.7 cm.). The imaged element is developed by soaking for 30 seconds in methyl chloroform and then by spraying with water leaving a dot-etched high contrast litho negative of the original transparency.

EXAMPLE 7

An opaque contiguous layer is prepared as described in Example 4. A crosslinkable, photosensitive composition containing a bis-diazonium salt in a macromolecular organic polymer binder as described in assignee's Roos, U.S. Pat. No. 3,778,270, Example II, is next prepared and coated on top of the dried opaque contiguous layer. A halftone image transparency is then placed on the dried, photosensitive layer, which is then exposed and developed as described in Example II of that reference. The bared areas of the opaque contiguous layer are then removed by spraying the element for 10 seconds with the 3% aqueous wash out solution described in Example 4 leaving a positive dot-etched image of the original which is useful as a duplicate halftone transparency.

EXAMPLE 8

An opaque contiguous layer is prepared as described in Example 4. A photosoluble composition comprising polymers having recurring pendent o-quinone diazide groups as described in assignee's Roos U.S. Pat. No. 3,837,860, Example I, is next prepared and coated on top of the dried opaque contiguous layer. A halftone image transparency is then placed on the dried, photosoluble layer and the element is exposed and developed as described in Example I of that reference. The developer used to wash out the exposed areas of the photosoluble composition also removes the same areas of the opaque contiguous layer and undercuts the edges of the unexposed areas so that upon brushing the resulting image is dot-etched to produce a positive image, or duplicate, of the original halftone transparency.

EXAMPLE 9

A positive working wash out element is made as follows:

I. Photodesensitizable Layer: Photopolymerizable Composition

A coating composition is prepared by mixing together the following ingredients:

| | Amount (g.) |
|---|---|
| Poly(methyl methacrylate/acrylic acid) (90/10) | 52.71 |
| Trimethylolpropane triacrylate | 36.61 |
| Triethylene glycol diacetate | 5.23 |
| Benzoin methyl ether | 2.5 |
| Nitrosocyclohexane dimer (Bluhm and Weinstein, Nature Vol. 215, page 1478, 1967) dissolved in 900 ml. methylene chloride | 3.0 |

The resulting solution is coated on a 0.0005 inch (0.013 mm) thick polyethylene terephthalate film and dried.

II. Opaque Contiguous Layer

This layer is made and coated according to Step II of Example 5 above.

III. Laminating Procedure

The two elements I and II are laminated in surface to surface relationship at a temperature of 49° C. and a pressure of 40 pounds per square inch (2.81 kg/cm.²).

IV. Exposure and Development

The film element resulting from step III is exposed through a cellulose acetate halftone process transparency to the full spectrum of a 100 watt high pressure mercury resonance lamp for 4 minutes, the transparency is removed and the film element is exposed for 6 minutes to radiation limited to wavelengths greater than 3400 A (Corning 0- 52 filter) the exposed areas of the photodesensitizable layer is developed by wash out with water followed by a solution of 40 grams of Borax and 500 grams of 2-ethoxyethanol in 4 liters of water. The bared opaque contiguous positive image is developed and dot-etched as described in Example 5 to give a halftone litho positive of the original transparency.

EXAMPLE 10

120 cc of Photoresist solution KPR Type 1, Eastman Kodak Co., Rochester, New York, associated with photocrosslinked composition of a polyvinyl cinnamate type, is added to 1500 ml. of methanol, and the precipitate formed is dried. 1 g. of the dried precipitate is dissolved in 5 ml. of methylene chloride to which is added 0.07 g. of 1-methyl,2-benzoyl methylene-β-naphthiazoline and the solution is coated with aid of a 0.002 inch (0.05 mm) doctor knife on the contiguous layer described in Example 4.

The element is exposed through a photographic transparency for 4 minutes using a Sylvania Black Light, blue lamps, Model No. 15T8-BLB, intensity of 1.9 milliwatt/cm.². The exposed element is developed by soaking for 5 seconds in a mixture of 5 parts/volume Cellosolve and 1 part/volume of ethylene glycol monomethyl ether acetate and rubbing with a cotton swab. The unexposed areas of the photosensitive layer and corresponding areas of the contiguous layer are removed down to the support.

EXAMPLE 11

An opaque contiguous layer is prepared as described in Example 4 except that the layer is coated to give a dry coating thickness of about 0.014 mm and an optical density greater than 4.0. A polycondensation product of an aromatic diazonium compound is then made as described in Steppan, U.S. Pat. No. 3,849,392, Example 35, and is coated over the dried contiguous layer. A halftone image transparency is then placed on the dried photosensitive layer which is then imagewise exposed and developed by spraying the element with 1% aqueous wash out solution of 9 parts of sodium carbonate and 1 part sodium bicarbonate. A negative image of the original transparency is obtained which is useful as a contact litho transparency.

EXAMPLE 12

A solvent developable element is made as follows:

I. Opaque Contiguous Layer

| | Amount (parts) |
|---|---|
| Copolymer of methylmethacrylate (90%) methacrylic acid (10%) M.W. range 30,000–50,000 | 382 |
| Mixed ester of triethylene glycol dicaproate and diacrylate, refractive index 1.446 at 25° C. | 13 |
| Trimethylol propane triacrylate | 245 |
| Grasol ® Fast Orange 2RN, CI Solvent Orange 33 (a mixture of Solvent Red 30, CI 27291 and dicyclohexyl-amine salts of a bisazodisulfo acid dye) | 131 |
| Luxol ® Fast Black L (CI Solvent Black 17) | 138 |

The above materials are dissolved in methylene chloride/2-ethoxyethanol (7:3 ratio by volume) to yield a coating solution containing 20% solids. This solution is coated on a polymeric film support to yield a dried opaque contiguous layer with a thickness of 0.010 mm and an optical density greater than 3.0.

II. Photohardenable Layer: Photocrosslinkable Composition

Kodak Photoresist solution KPR Type 1 prepared as described in Example 10 is coated with a 0.002 inch (0.05 mm) doctor knife over the surface of the opaque contiguous layer.

The coated element is then exposed and developed as described in Example 10 to remove the unexposed image areas. The corresponding dye containing areas of the contiguous layer are then removed from the support film by immersion for 30 seconds in an aqueous solution of 35 g. sodium carbonate monohydrate, 226.5 g. butyl Cellosolve, and 3290 g. water at ~27° C. followed by a water rinse. The resulting image is a high contrast litho negative of the original transparency.

EXAMPLE 13

A positive working wash out element is made as follows:

I. Opaque Contiguous Layer

| | Amount (parts) |
|---|---|
| Aqua Blak ® S Dispersion (45% aqueous dispersion of furnace carbon black) | 558 |
| Polyvinyl alcohol (9% aqueous solution) | 927 |
| Sodium N-coco-β amino propionate (10% aqueous solution) | 75 |
| Water | 3440 |

This composition is coated on a subbed 0.004 inch (0.10 mm) polyethylene terephthalate film to give a dry coating thickness of about 0.002 mm and an optical density greater than 3.0.

II. Photodesensitizable Layer: Photopolymerizable Composition

| | Amount (parts) |
|---|---|
| Terpolymer formed from 56% ethyl acrylate, 37% methyl methacrylate and 7% acrylic acid, M.W. ca. 260,000, acid number 76–85 | 14.0 |
| 1:1 copolymer of styrene and maleic anhydride, partially esterified with isopropyl alcohol M.W. ca. 1700, acid number ca. 270 | 14.2 |
| Tetraethylene glycol dimethacrylate | 6.8 |
| o-Nitroveratraldehyde | 1.0 g |
| 2,5-bis(2'-methyl-4'diethyl amino benzylidene) cyclopentanone | 0.6 |
| (2-o-chlorophenyl-4,5-diphenyl imidazolyl)dimer | 1.0 |
| Methylene chloride | 211 |
| Methanol | 16 g |

The above composition is coated over the opaque contiguous layer using a 0.002 inch (0.05 mm) doctor knife and dried. The two-layer composite is then laminated with a 0.001 inch (0.025 mm) polyethylene terephthalate film at about 100° C.

III. Exposure and Development

The photodesensitizable layer of the resultant film element is imagewise exposed through a halftone transparency to the full spectrum of a 4 KW pulsed xenon lamp for 40 seconds. The transparency is removed and the film is exposed for 2 minutes to radiation limited to wavelengths greater than 4000 A (e.g., Wratten ® 2E filter). The 0.001 inch (0.025 mm) polyethylene terephthalate film is removed, and the layers are developed by washing out the imagewise exposed areas by flooding the layer surface with the developer solution of Example 4 at 80° F. (~27° C.) for about 7 seconds followed by spraying with water at 90° F. (32° C.) for about 7 seconds. The resulting developed image is a duplicate halftone positive of the original transparency.

EXAMPLE 14

A positive working wash out element is made as follows:

I. Opaque Contiguous Layer

A 0.004 inch (0.10 mm) thick polyethylene terephthalate clear film support, prepared as described in Example IV of Alles U.S. Pat. No. 2,779,684, containing an insoluble resin sub on one side only is coated on the resin sub surface with the following coating composition:

| | Amount (parts) |
|---|---|
| Terpolymer formed from 56% ethyl acrylate, 37% methyl methacrylate and 7% acrylic acid, M.W. ca. 260,000, acid number 76–85. | 55 |
| Colloidal carbon | 45 |

| | Amount (parts) |
|---|---|
| Stearic acid | 1 |

The above components are milled dry in a high shear mixer. The coating composition is prepared from 10 parts by weight of the milled material, 9 parts by weight of 2-ethoxyethanol and 81 parts by weight of methylene chloride and coated to give a dry thickness of about 0.005 mm and an optical density of about 3.5.

II. Photosoluble Layer

A coating composition is prepared by mixing together the following ingredients:

| | Amount (g.) |
|---|---|
| Shipley Photoresist AZ-1350J (30% solids) (positive working photoresist solution of Shipley Co.) | 4.0 |
| Methylene chloride | 3.0 ml. |

The resulting solution is coated with a 0.002 inch (0.05 mm) doctor knife over the surface of the opaque contiguous layer and is dried.

The coated element is exposed through a photographic transparency for 2 minutes to the light source described in Example 10. The exposed element is developed by soaking for 5 seconds in a 2% solution of sodium hydroxide and rubbing with a cotton swab. The exposed areas of the photosoluble layer and the bared carbon containing areas of the contiguous layer are removed.

I claim:

1. In a photosensitive dot-etchable litho element having a sheet support and a solvent-processable non-silver halide photosensitive layer, the exposed areas of the solvent-processable photosensitive layer, after imagewise exposure of the element to actinic radiation, being solvent-soluble, the improvement wherein between the support and the photosensitive layer and contiguous thereto is present a non-photosensitive, solvent-soluble dye or pigment-containing layer having an optical density of at least 3.0 in the visible region of the spectrum and a maximum thickness of 0.015 mm, said contiguous layer being adhered to the support.

2. An element according to claim 1 wherein the photosensitive layer is photodesensitizable.

3. An element according to claim 1 wherein the photosensitive layer is photosolubilizable.

4. An element according to claim 1 wherein the photosensitive layer is aqueous-processable.

5. An element according to claim 1 wherein the contiguous layer is soluble in a solvent for the photosensitive layer.

6. An element according to claim 1 wherein the contiguous layer is soluble in an aqueous solution.

7. An element according to claim 1 wherein the optical density of the contiguous layer is at least 4.0.

8. An element according to claim 1 wherein the thickness of the contiguous layer ranges from 0.0011 to 0.015 mm.

9. An element according to claim 1 wherein the thickness of the contiguous layer is 0.010 mm.

10. An element according to claim 1 wherein the support is a film sheet support.

11. An element according to claim 1 wherein the contiguous layer is non-elastomeric.

* * * * *